United States Patent
Kundman et al.

(10) Patent No.: US 11,754,426 B2
(45) Date of Patent: Sep. 12, 2023

(54) TRANSDUCER SENSOR SYSTEM

(71) Applicant: Westinghouse Air Brake Technologies Corporation, Wilmerding, PA (US)

(72) Inventors: Benjamin Richard Kundman, Pittsburgh, PA (US); Jeffrey John Hritz, Jefferson Hills, PA (US); Samir Ganesh Kamat, Pittsburgh, PA (US)

(73) Assignee: Westinghouse Air Brake Technologies Corporation, Pittsburgh, PA (US)

( * ) Notice: Subject to any disclaimer, the term of this patent is extended or adjusted under 35 U.S.C. 154(b) by 761 days.

(21) Appl. No.: 16/722,933

(22) Filed: Dec. 20, 2019

(65) Prior Publication Data

US 2020/0217693 A1 Jul. 9, 2020

Related U.S. Application Data

(60) Provisional application No. 62/788,456, filed on Jan. 4, 2019.

(51) Int. Cl.
| | |
|---|---|
| *H02K 11/00* | (2016.01) |
| *G01D 11/24* | (2006.01) |
| *H02K 11/25* | (2016.01) |
| *H02K 11/27* | (2016.01) |
| *H01R 11/01* | (2006.01) |
| *H01R 11/28* | (2006.01) |
| *G01R 31/34* | (2020.01) |
| *H02K 5/22* | (2006.01) |
| *H01R 11/09* | (2006.01) |

(52) U.S. Cl.
CPC ......... *G01D 11/245* (2013.01); *G01R 31/343* (2013.01); *H01R 11/01* (2013.01); *H01R 11/28* (2013.01); *H02K 5/225* (2013.01); *H02K 11/25* (2016.01); *H02K 11/27* (2016.01); *H01R 11/09* (2013.01)

(58) Field of Classification Search
CPC ...... G01D 11/245; H02K 11/25; H02K 11/27; H02K 5/22; H02K 5/225; H02K 15/14
USPC ....................................................... 310/68 C
See application file for complete search history.

(56) References Cited

U.S. PATENT DOCUMENTS

| | | | | |
|---|---|---|---|---|
| 3,474,383 | A * | 10/1969 | Bohdan ................... | H01R 9/26 439/716 |
| 2010/0025102 | A1* | 2/2010 | Nishikawa .......... | B60R 16/0238 174/535 |
| 2015/0015249 | A1* | 1/2015 | Ausserlechner ........ | H01L 24/48 324/252 |
| 2020/0309822 | A1* | 10/2020 | Tamura .............. | G01R 19/0092 |
| 2020/0393306 | A1* | 12/2020 | Yoshihara ................ | G01K 7/22 |
| 2021/0003614 | A1* | 1/2021 | Esaka .................. | G01R 33/091 |

* cited by examiner

*Primary Examiner* — Thomas Truong
(74) *Attorney, Agent, or Firm* — THE SMALL PATENT LAW GROUP LLC; Josef L. Hoffmann (57) ABSTRACT

A system that may include a bus bar that may include a mounting bracket configured to electrically couple the bus bar to a motor. The mounting bracket may also be configured to be removably coupled to the motor with at least one fastener. A transducer may be electrically coupled to the bus bar and have transducer elements. A dielectric material may be disposed between the bus bar and the transducer to prevent debris from contacting the active transducer elements and electrical arcing from occurring.

20 Claims, 6 Drawing Sheets

TRANSDUCER SENSOR SYSTEM

CROSS REFERENCE TO RELATED APPLICATIONS

This application claims priority to U.S. Provisional Patent Application No. 62/788,456, entitled COMPACT ENCAPSULATED SENSOR: HARSH ENVIRONMENT, which was filed on 4 Jan. 2019, and the entire disclosure of which is incorporated herein by reference.

BACKGROUND

Technical Field

The present disclosure relates to transducer sensors and a system of transducer sensors, and, specifically, to transducer sensors.

Discussion of Art

Existing motor sensors are designed to attach directly to an electric motor, motor housing, or leads in order to sense the electrical signals of the motor. Often times, these sensors can suffer damage from exposure to the elements found in an industrial setting that typically surrounds the motors. Debris such as dirt, grease, oil, soot, and other particulates can damage the current motor sensors. Furthermore, vibrations occurring during operation of the motor or accidental outside forces, commonly applied to motors, may cause further damage to current motor sensors.

Additionally, when dealing with sensors measuring current or voltage of a motor, there is a potential for disadvantageous electrical arcing to occur between conductive elements placed near one another when at least one of the elements has a high current or voltage running through it. Therefore, it may be desirable to have a compact encapsulated motor sensor that is structured to resist physical damage brought on by an industrial environment as well as physical, outside forces. It may also be desirable to have a compact motor sensor configured to prevent electrical arcing between the sensor's components.

BRIEF DESCRIPTION

In accordance with one embodiment, a system may be provided that includes a bus bar, and a transducer coupled to the bus bar and having one or more transducer elements. The system may also include a layer of dielectric material disposed between the bus bar and the transducer.

In accordance with one embodiment, a system may be provided that may include a bus bar including a mounting bracket configured to couple the bus bar to a motor. The mounting bracket may also be configured to be removably coupled to the motor with at least one fastener, and a transducer may be coupled to the bus bar and having transducer elements. The transducer may be coupled to the bus bar such that the mounting bracket forms a space between the transducer and the motor. A layer of dielectric material may at least partially encapsulate the transducer, at least partially encapsulate the bus bar, and at least be partially within the space between the transducer and the motor.

In accordance with one embodiment, a method may be provided that includes removing a first bus bar and first sensor from a motor, and coupling a second bus bar with a second sensor coupled thereto to the motor to replace the first bus bar and first sensor. A layer of dielectric material may be positioned between the second bus bar and second sensor.

BRIEF DESCRIPTION OF THE DRAWINGS

The inventive subject matter may be understood from reading the following description of non-limiting embodiments, with reference to the attached drawings, wherein below.

DETAILED DESCRIPTION

In one or more embodiments, a motor sensor and a system of motor sensors are provided. Specifically, the sensor measures an electrical or mechanical load, such as the current, running through the motor at any given time during operation. The motor sensor may be used with any motor or engine capable of being configured to have a sensor attached or mounted to it including, but not limited to, alternators, vehicle motors, pump motors, compressor motors, industrial motors, or any other motor from which a user would benefit from being able to measure an electrical, mechanical, or thermal load running through the motor.

Unlike other sensors that may be too large, bulky, or awkwardly shaped to properly mount to a motor, embodiments of the present disclosure result in a compact and easily replaceable motor sensor. The location of most motors in application often exposes sensors to an industrial environment rife with damaging debris such as soot, dirt, and grime. In another aspect, the sensor is protected, thereby avoiding damage typically brought on by debris exposure for a longer period of time than currently available sensors. Furthermore, use of a sensor in a harsh, industrial environment often means sensors are placed nearby high voltage or high current areas. This could cause potentially undesirable electrical arcing between two adjacent pieces of metal. In an embodiment, electrical arcing is prevented from occurring between metallic portions of the sensor.

In particular, the sensor provided may be coupled to a bus bar to receive current from the bus bar that may be sensed or detected by transducer elements of the sensor to provide a reading. A layer of dielectric material may be disposed between the bus bar and the transducer element to close access to the interior of the transducer to prevent debris from contacting the transducer elements. The layer of dielectric material may encapsulate the entire transducer, or only partially encapsulate the transducer. In either instance, access to the interior of the transducer may be blocked by the dielectric material. By preventing debris and other materials from reaching the transducer elements, less wear and more accurate readings result. Additionally, the bus bar may include a mounting bracket for removably coupling to a motor through a fastener or other manner. In this manner, an old worn sensor may be replaced with the sensor in a retrofit environment. Additionally, the mounting bracket may be of any size and shape to fit within the space required to couple to the motor. The size and shapes include flat mounting brackets, L-shaped mounting brackets, U-shaped mounting brackets, J-shaped mounting brackets, Z-shaped mounting brackets, or etc. In particular, in some example embodiments, the mounting bracket may be shaped to space the transducer elements from the motor to reduce the likelihood of arcing. Additionally, dielectric material can be filled into this space to further reduce arcing and malfunction.

Figure 1:
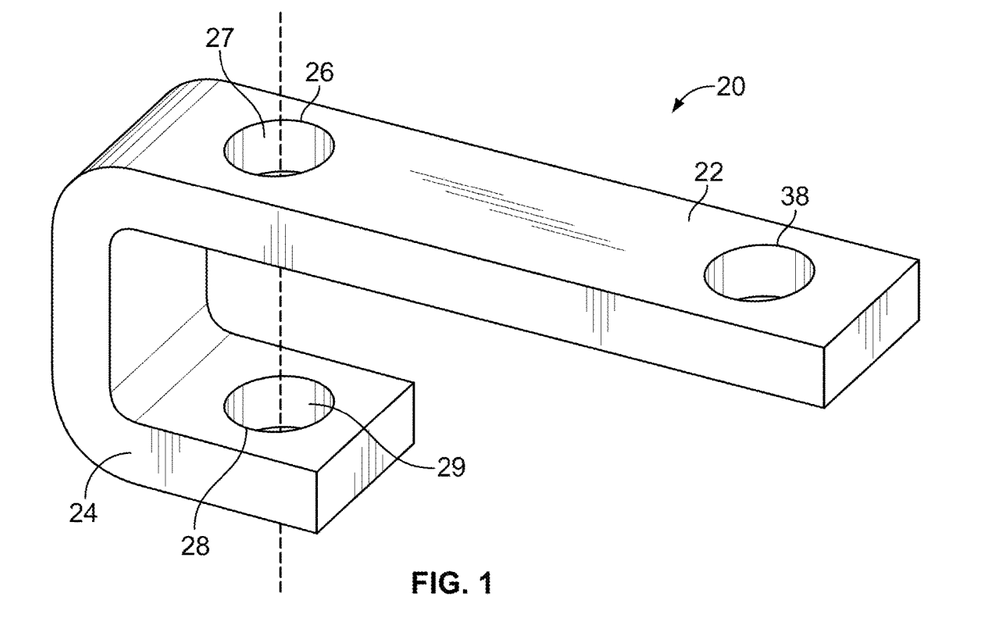
FIG. 1 illustrates a perspective view of a bus bar.

Referring to FIG. 1, in some embodiments or aspects, the motor sensor 2 may include a bus bar 20. The motor sensor 2 may be coupled to a motor (not shown), as described below, to measure an electrical or thermal load running through the motor. The motor sensor 2 may be coupled in any manner, including electrical coupling, mechanical coupling, inductive coupling, thermal coupling, etc. In one example, the bus bar current is at least 400 amps alternating current (400 A AC or 400 volts AC, aka 400 VAC). The bus bar 20 may comprise multiple portions. A bar portion 22 of the bus bar 20 may extend along the top of the motor sensor 2 while a mounting bracket 24 may extend as an appendage from the bar portion. The mounting bracket may be of any size or shape, including flat, L-shaped, U-shaped, J-shaped, Z-shaped, or the like. In each instance, the mounting bracket may be shaped to fit the space of an existing motor. In addition, in embodiments, such as L-shaped embodiment, where the mounting bracket provides a space between the coupling to the motor and the bar portion, electrical arcing may be reduced.

The mounting bracket in the example of FIG. 1 may curl under the bar portion of the bus bar. With the mounting bracket curling under the bar portion, the bus bar has a J-shape. The J-shape may limit the exposure of the bus bar to damaging debris that may be present in an industrial application. The shape also may lessen the potential for vibrational damage to the bus bar due to its cantilevered nature. The bus bar may be made up of any suitable material that conducts electricity such as copper, brass, aluminum, silver, or gold.

The bar portion and the mounting bracket may have corresponding apertures to facilitate fastening of the motor sensor. In an embodiment, the motor sensor fastens to the motor housing, but the motor sensor may also fasten directly to the motor. A first aperture 26 may be located on the bar portion and defined by a first sidewall 27. The first aperture may align with a second aperture 28 located on the mounting bracket. The second aperture may be defined by a second sidewall 29.

Figure 2:
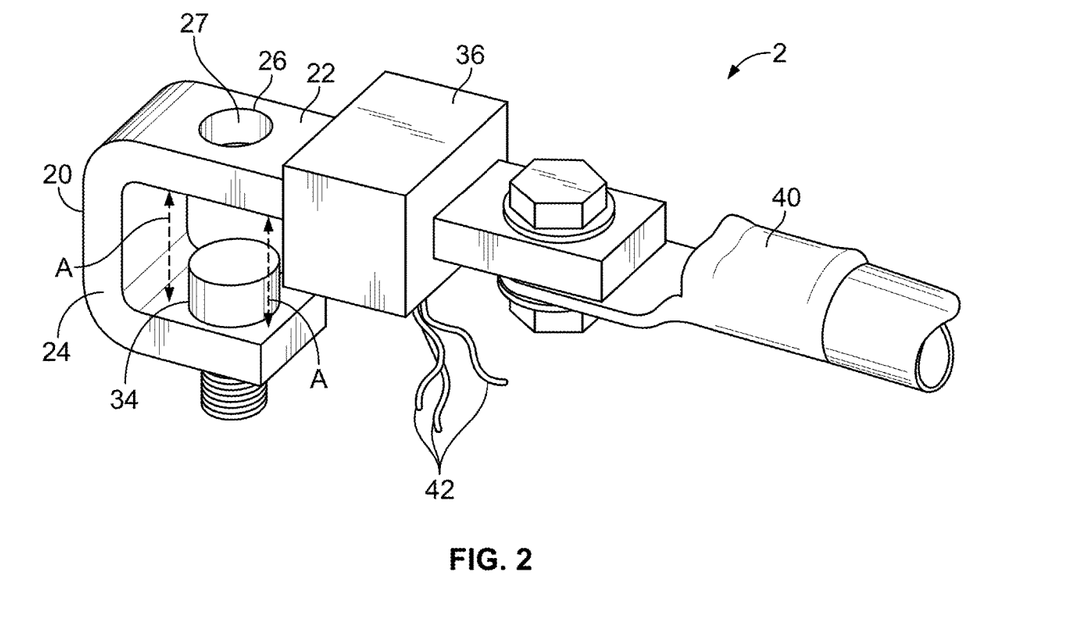
FIG. 2 illustrates a perspective view of a motor sensor coupled to a motor lead.
Figure 5:
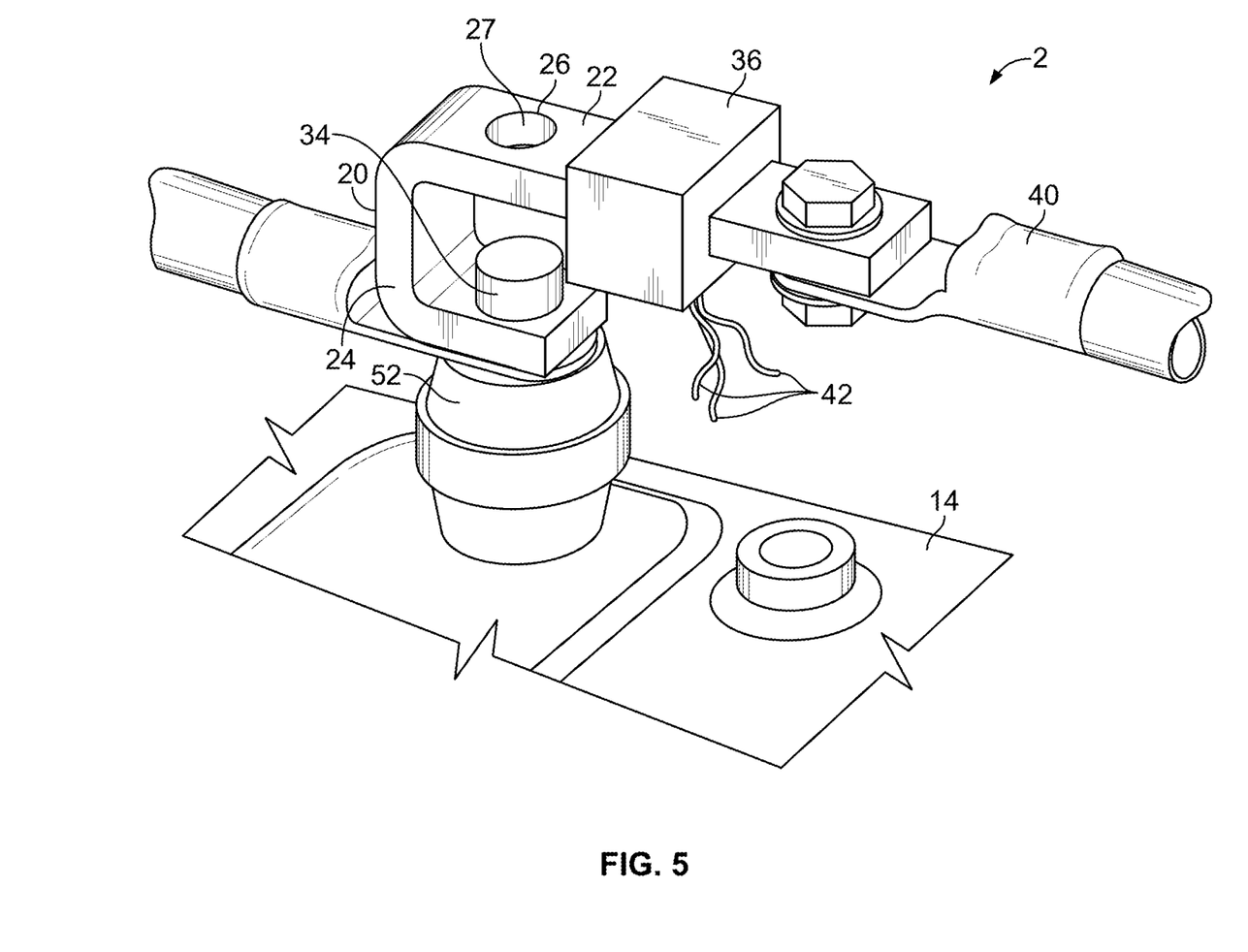
FIG. 5 illustrates a perspective view of a motor sensor of FIG. 2 attached to a motor housing.

As shown in FIGS. 2 and 5, the first and second apertures align to permit a fastener 34 to be applied to the motor sensor. The fastener may connect the motor sensor to the motor housing or the motor in a fashion to permit motor sensor to be in a position to better measure the mechanical, electrical, or thermal load running through the motor. In addition, the fastener permits the motor sensor to be easily installed on a motor. In this manner, a malfunctioning or inaccurate motor sensor may be removed and the motor sensor removably attached to the motor as a replacement. The fastener may engage directly with the second aperture and the motor housing or it may engage with both the first and second apertures and the motor housing. The fastener may be any suitable mechanical fastener such as a screw, bolt, pin, rivet, or clamp. Alternatively, adhesive, press fit, snap fit, magnetic coupling, etc. may be provided.

Referring now to FIG. 2, in some embodiments or aspects, the bus bar may support a transducer 36. The transducer may be any kind that may be suitable for measuring a thermal or electrical load running through the motor such as a current transducer, reductive transducer, capacitive transducer, temperature transducer, or ultrasonic transducer. The transducer may have a range between −670 and +670 A. In some examples the range is −100 to +100 A, −175 to +175 A, −300 to +300 A, −425 to +425 A, −550 to +550 A, or −670 to +670 A. In an embodiment, the transducer may be supported on the bar portion of the bus bar. The transducer may be supported along any portion of the bus bar, such as the mounting bracket, that permits the transducer to sense electrical signals running through the bus bar.

The transducer may include transducer elements 37 that may be located on an interior 35 (FIG. 4) of the transducer and operate to sense the current, or characteristic being sensed. The transducer elements may include active transducer elements, and/or comprise a titanate including barium, strontium, etc. The transducer element may also include positive temperature coefficient (PTC) elements. In particular, in example embodiments the transducer elements may be thermistors that increase in resistance as temperature of the elements increases.

To permit electrical signals to run through the bus bar, the bar portion has a third aperture 38 configured to accept an electrical lead 40 coming from power supply. The electrical lead may be any suitable connection means to electrically link the motor to the bus bar, such as crimps, terminal blocks, plugs and sockets, blade connectors, or screw terminals. The electrical lead between the motor and the bus bar permits the same electrical signals running through the motor to also run through the bus bar. In this configuration, the transducer may detect the voltage, current, or other electrical signals running through the motor by way of the bus bar.

The transducer may also have an electrical output 42. The electrical output may be coupled to the transducer and a monitoring device (not shown) such as a computer, server, or other data storage unit, so that the data signals obtained by the transducer may be obtained by a user of the motor sensor. The electrical output may be electrically coupled, wired coupling, wirelessly coupled, mechanically coupled, inductively coupled, thermally coupled, or the like to the transducer. In example of an electrical coupling, the coupling may be any means necessary to transmit data from the transducer to an output such as a USB, micro-USE, audio, visual, digital-to-analog converter, or computer connection.

Figure 3:
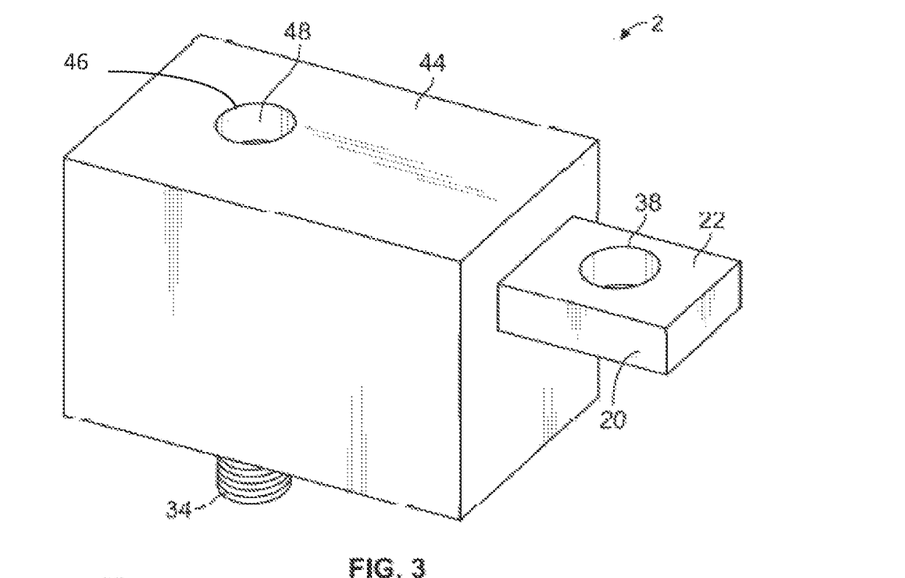
FIG. 3 illustrates a perspective view of a motor sensor.
Figure 4:
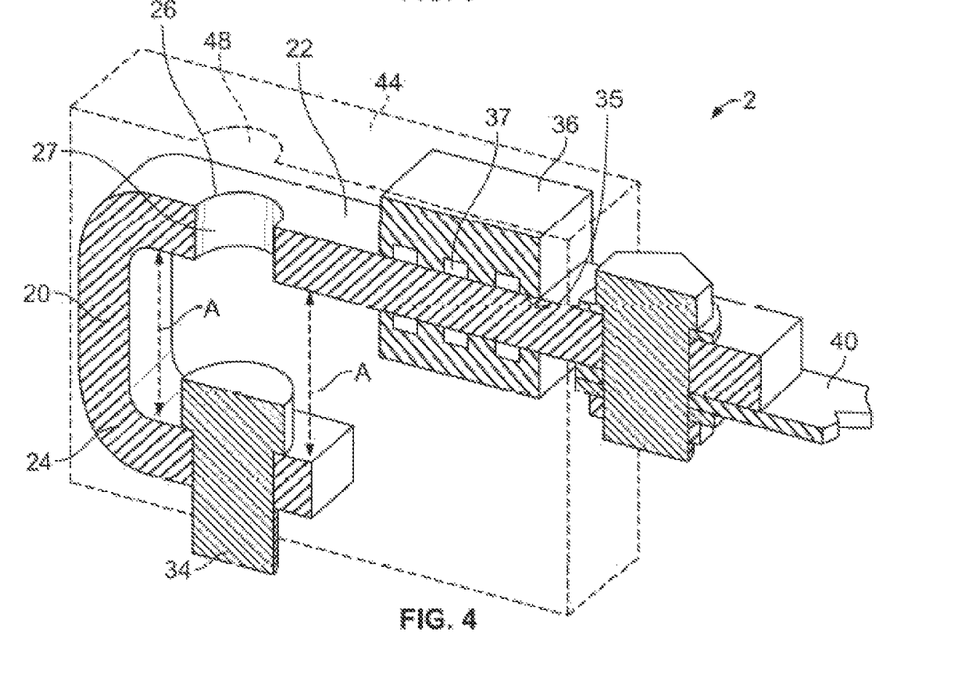
FIG. 4 illustrates a cross-sectional perspective view of a motor sensor of FIG. 2.

As shown in FIGS. 3 and 4, in other embodiments or aspects of the present disclosure, the motor sensor may be surrounded by a layer 44 of potting, or dielectric material. The layer of dielectric material may be less than 20 millimeters (mm). In one example, the layer may be in a range between 1 mm and 15 mm thick. The layer of dielectric material may have a dielectric constant of less than six (6) at room temperature (25° C.). The layer of dielectric material may similarly have a dielectric strength of above 450 volts per mil (V/mil) where a mil is $1/1000$ of an inch. In one example, the dielectric material has a dielectric strength of at least 470 V/mil. The dielectric material may be any nonconductive material known such as silicone, ceramic, epoxy, or, more specifically, Loctite® EA E-60NC or Dow Sylgard 170 industrial grade epoxy. In one embodiment or aspect, the dielectric material may be a single, liquid substance that solidifies or cures around the motor sensor encapsulating at least a portion of the motor sensor. In another embodiment, the dielectric material may be a two-part silicone or epoxy that solidifies or cures around at least a portion of the motor sensor after the two parts of the silicone or epoxy are mixed together.

The layer of dielectric material may surround the mounting bracket and the bar portion of the bus bar, so as to encapsulate any opposing portions of the mounting bracket and the bar portion that may create a potential arc path as indicated by dashed lines A in FIGS. 2 and 4. The layer of dielectric material may also surround all or part of the transducer. Specifically, the dielectric material may be between the bus bar and the transducer to prevent debris or other materials from entering the interior of the transducer. In this manner, the transducer elements that are sensing a characteristic are protected, reducing wear of the elements.

Some of the bar portion that contains the third aperture may remain outside of the layer of dielectric material, so that the bus bar may remain coupled to the motor (not shown) by way of the electrical lead and the transducer can still detect the voltage or current running through the motor in the manner described above. A portion of the electrical output coming from the transducer may also remain outside the layer of dielectric material so as to maintain the connection between the transducer and the output. Because the transducer may be supported directly on the bar portion, the layer of dielectric material does not affect the transducer's ability to detect the current or voltage travelling through the bus bar.

When molding or forming the layer of dielectric material around the motor sensor, the layer of dielectric material may define a sleeve 46 having a sidewall 48 to provide access to the fastener so that the motor sensor may be added to or removed from the motor housing after the layer of dielectric material has been applied. A removable, non-metallic sleeve (not shown) may be used to define the sleeve until the encapsulating material cures or dries. After the curing or drying of the encapsulating material, the non-metallic sleeve may be removed from the encapsulating material.

As shown in FIG. 5, in an example embodiment, the electrical current may travel from a vehicle motor through the electrical lead, through the bar portion, and through the mounting bracket. After traveling through the mounting bracket, the electricity travels through bus bar and to the motor terminals and leads.

To isolate the current and voltage traveling through the motor sensor, the fastener of motor sensor may fasten to an insulator block 52. The insulator block may be attached to the motor housing. The insulator block may be made of any material known to insulate the surrounding area from electricity such as fiberglass, rubber, polyvinyl chloride, Teflon®, silicone, or epoxy. The fastener may connect only to the insulator block to prevent the current or voltage traveling through the sensor from traveling through the motor housing and the motor. The insulator block may take any shape necessary to surround the fastener and prevent an electrical connection between the motor housing and the fastener.

Figure 6:
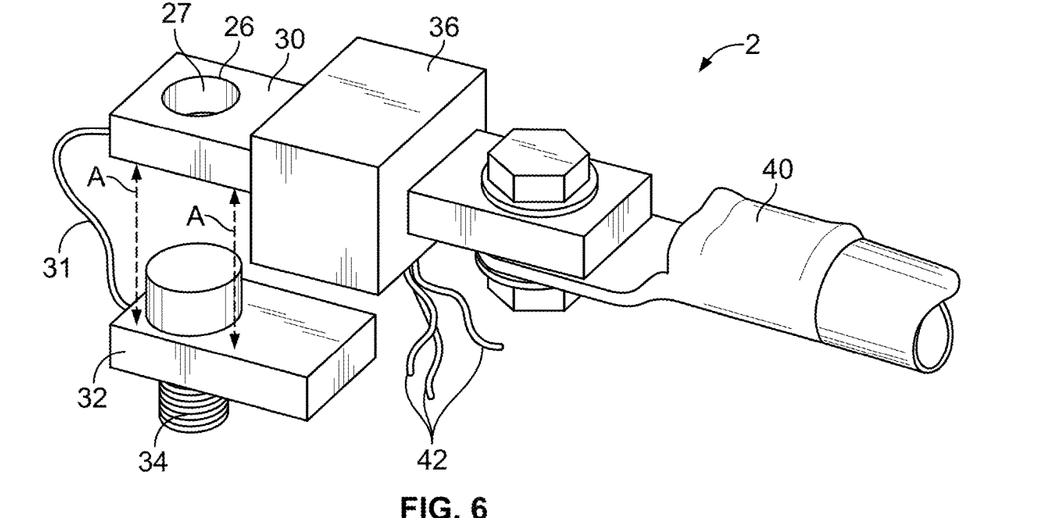
FIG. 6 illustrates a perspective view of a motor sensor coupled to a motor lead.

As shown in FIG. 6, in another embodiment or aspect, the bus bar may have a first portion 30 and a second portion 32. The first portion and the second portion may have an electrical connection 31 between them so that electricity may be permitted to travel through the first and second portions. The first and second portions are configured so that they are separated by a space. In this embodiment, the first aperture may be located on the first portion, and the second aperture may be located on the second portion. The first and second portions are configured so the first and second apertures are aligned to accept the fastener in a similar manner as described above. The fastener may engage directly with the second aperture and the motor housing or it may engage with both the first and second apertures and the motor housing. The fastener may be any of the fasteners as described in detail above.

In this embodiment, the first portion of the bus bar may support the transducer. The transducer may be any kind that may be suitable for measuring a mechanical, electrical, or thermal load running through the motor such as a current transducer, reductive transducer, capacitive transducer, temperature transducer, or ultrasonic transducer. The first portion may have a third aperture configured to accept the electrical lead leading from the motor. The electrical lead may be any suitable connection means to electrically link the motor to the first portion as crimps, terminal blocks, plugs and sockets, blade connectors, or screw terminals. The electrical lead 40 between the motor and the first portion may be configured to allow the same electrical signals running through the motor to also run through the first portion. Because the first and second portions have an electrical connection between them, the electrical signals will also run through the second portion. In this configuration, the transducer may detect the voltage, current, or other electrical signals running through the motor by way of the first portion. The electrical current travels from the motor through the electrical lead, the first portion, the electrical connection, the second portion, and ultimately through the fastener. Because of this, the fastener of motor sensor may fasten to an insulator block instead of directly to the motor housing.

In one embodiment, the fastener may connect only to the insulator block to prevent the current or voltage traveling through the sensor from traveling through the motor housing and the motor. Alternatively, the insulator block may be attached to the motor housing. In each instance, the motor sensor may easily and removable couple within a component of an existing engine. The insulator block may be made of any material known to insulate the surrounding area from electricity such as fiberglass, rubber, polyvinyl chloride, Teflon®, silicone, or epoxy. The insulator block may take any shape necessary to surround the fastener and prevent an electrical connection between the sensor and the motor housing by way of the fastener.

In this embodiment, the transducer and the electrical output may function in the same manner as described above. The motor sensor may also be surrounded by a layer of dielectric material as described above. The layer of dielectric material may be configured to prevent electrical arcing between the first portion and the second portion, with potential arc paths indicated by dashed lines A on FIG. 6. The layer of dielectric material may encapsulate the coupling between the first and second portions. In one example, the layer of dielectric material may also encapsulate some or all of the first and second portions, including the transducer supported on the first portion, so long as the third aperture on the first portion maintains its electrical connection with the motor by way of the electrical lead. In one example, the first portion and second portion are both fully encapsulated. In another example, the first portion is fully encapsulated while the second portion is partially encapsulated. Alternatively, the first portion is partially encapsulated while the second portion is fully encapsulated. In yet another example, the first portion and the second portion are both partially encapsulated. Alternatively, only one of the first or second portions are either fully or partially encapsulated and the other is not encapsulated.

A portion of the electrical output coming from the transducer may also remain outside the layer of dielectric material so as to maintain the connection between the transducer and the output. Because the transducer may be supported directly on the first portion, the layer of dielectric material does not affect the transducer's ability to detect the current or voltage travelling through the first portion. When molding or forming the layer of dielectric material around the motor sensor, the layer of dielectric material may define a sleeve having a sidewall to provide access to the fastener so that the motor sensor may be fastened or unfastened from the motor, motor housing, or insulator block after the layer of dielectric material has been applied. The sleeve may then align with corresponding first and second apertures.

Figure 9:
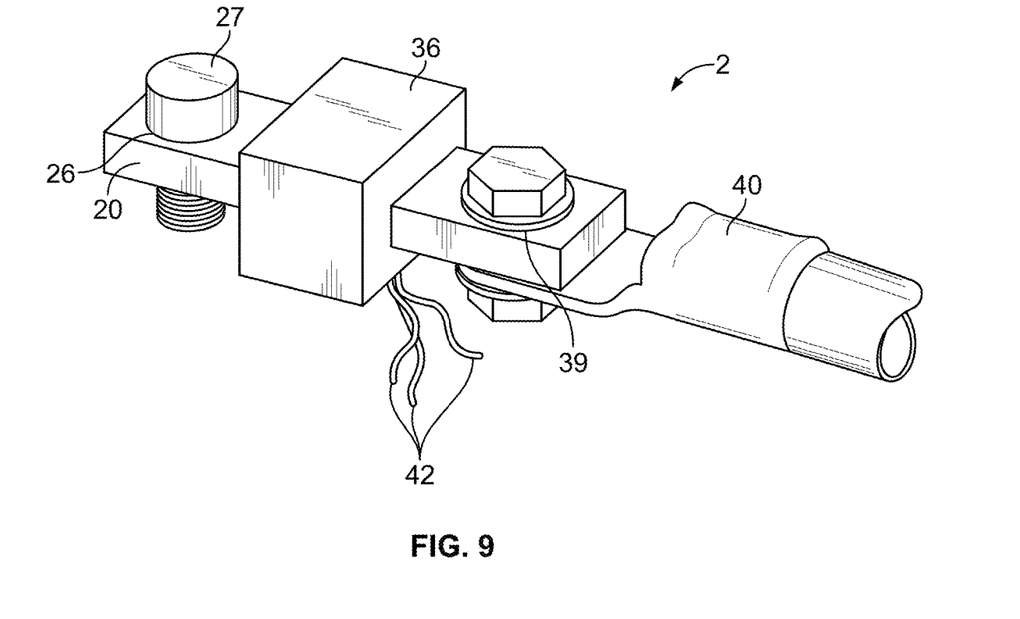
FIG. 9 illustrates a perspective view of a motor sensor.

Referring now to FIG. 9, in another embodiment or aspect of the motor sensor, the bus bar may be only a singular portion with a first aperture configured to accept the fastener and a second aperture 39 configured to accept the electrical lead leading from the motor. The fastener may engage directly with the motor housing or an insulator block as described above. The bus bar may support the transducer. The transducer may be any kind that may be suitable for measuring an electrical or thermal load running through the motor. In this embodiment, the electrical lead leading from the motor may attach directly to the fastener of the motor sensor between the insulator block and the bus bar. The electrical lead may also directly contact the bus bar below the first aperture. In this configuration, electrical signals may travel up through the fastener and into the bus bar where the signals are read by the transducer or electrical signals will travel through the bus bar by contact with the wire leads 40.

The electrical lead between the motor and the bus bar may be configured to allow the same electrical or thermal signals running through the motor to also run through the bus bar. The transducer may detect the voltage, current, temperature, or other signals or running through the motor by way of the bus bar. In this embodiment, the transducer and the electrical output may function in the same manner as described above. The motor sensor may also be surrounded by a layer of dielectric material as described above. The layer of dielectric material may be configured to protect the motor sensor from damage from debris, and it may encapsulate some or all of the bus bar, including the transducer supported on the bus bar, so long as the second aperture or the fastener may maintain its connection with the motor by way of the electrical lead. A portion of the electrical output coming from the transducer may also remain outside the layer of dielectric material so as to maintain the connection between the transducer and the output. Because the transducer may be supported directly by the bus bar, the layer of dielectric material does not affect the transducer's ability to detect the current, voltage, or temperature increase traveling through the bus bar.

Figure 7:
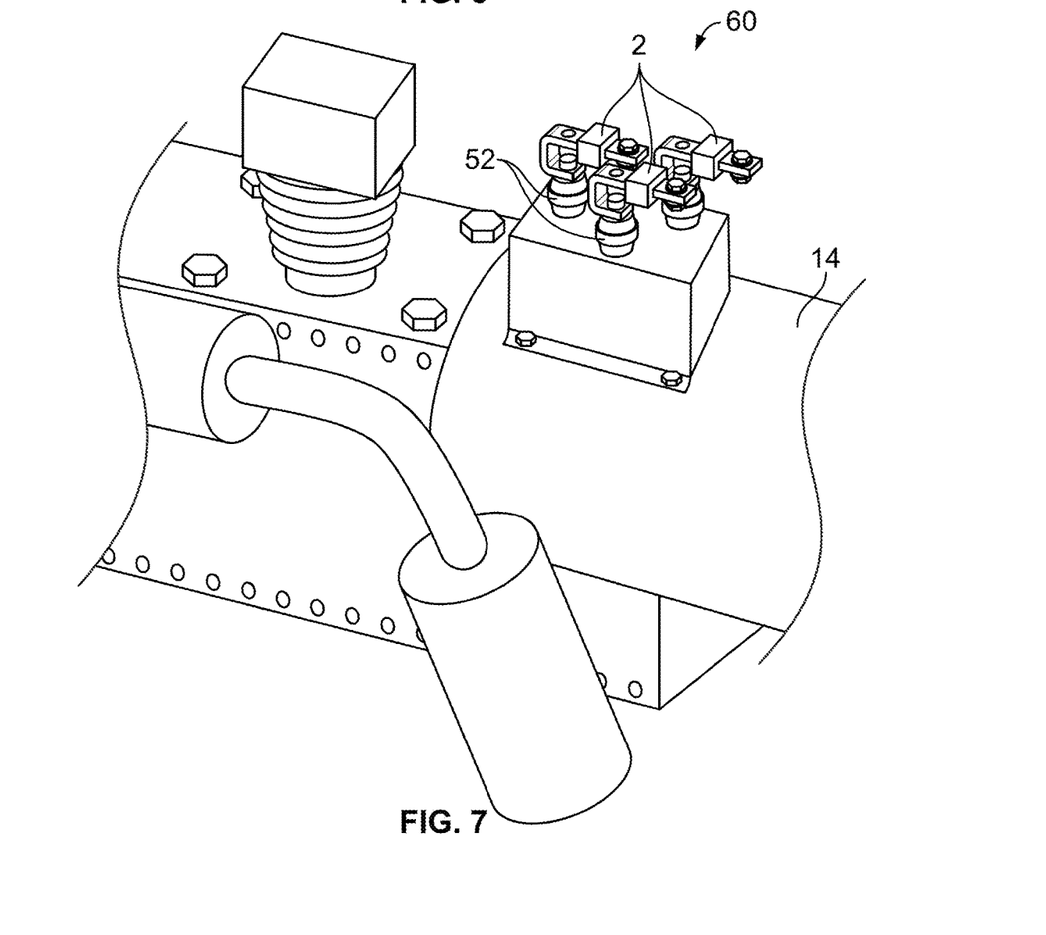
FIG. 7 illustrates a perspective view of a motor sensor system.
Figure 8:
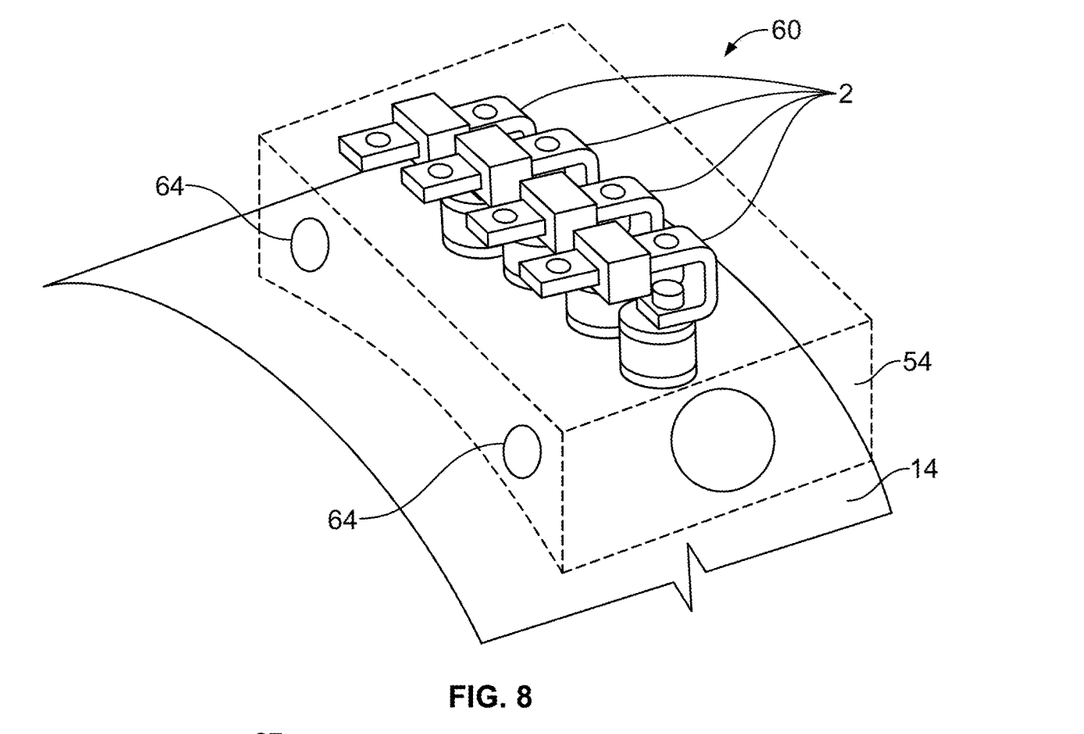
FIG. 8 illustrates a perspective view of a motor sensor system.

Referring now to FIGS. 7-9, in another embodiment or aspect, multiple motor sensors can be configured upon a motor housing to form a motor sensor system 60. In this embodiment multiple motor sensors may be placed across and coupled to the motor housing or motor. The motor sensors may be of any embodiment described above and any number of sensors may be used. Each individual motor sensor may be coupled to an individual, corresponding electrical lead running from the motor or multiple sensors may be coupled the same electrical leads running from the motor. Each motor sensor may be attached to an insulator block to prevent the electrical current running through each sensor from reaching the motor housing and motor. Each insulator block may be coupled to the motor housing. The electrical outputs running from the transducers of each motor sensor may each lead to an output configured so that a user may read the data obtained by each transducer. Each transducer may be coupled to the same output instead of individual ones. This embodiment may be preferable because multiple motor sensors may take a plurality of measurements regarding the electricity running through the bus bar and the motor at multiple points in time. This permits a user to make a more accurate and detailed analysis of the readings provided by the sensors to get a better understanding of the functionality of the motor and the electrical signals running through the motor.

The motor sensor system may have a protective motor sensing system housing 54. The motor sensor system housing may be designed in any way that provides protection to the motor sensors of the motor sensing system from the conditions commonly found in industrial settings. The motor sensor system housing may be coupled to the motor housing using any suitable means known to a person having ordinary skill in the art such as by use of mechanical fasteners or welding. The motor sensor system housing may be made of any material suited to protect the motor sensor system while avoiding electrical interference with the motor, motor leads, and motor sensors such as plastic, ceramic, fiberglass, or rubber.

The motor sensor system housing may also be provided with one or more access ports 64. The access ports are configured to permit the electrical leads to couple to the sensors and the electrical outputs to couple to their respective outputs. The access ports are also configured to permit a user access to the motor sensors within the motor sensor system housing. In the present embodiment, the access ports may be holes located along a sidewall of the motor sensor system housing, but the access ports may take any form such as that of a door, lid, or other opening so as to permit all electrical equipment associated with the motor sensor system to function properly and to permit a user access to the motor sensors. Access ports may be utilized by both power supply cabling and for user access. Additionally, the motor sensor system housing may be used with a singular motor sensor.

Figure 10:
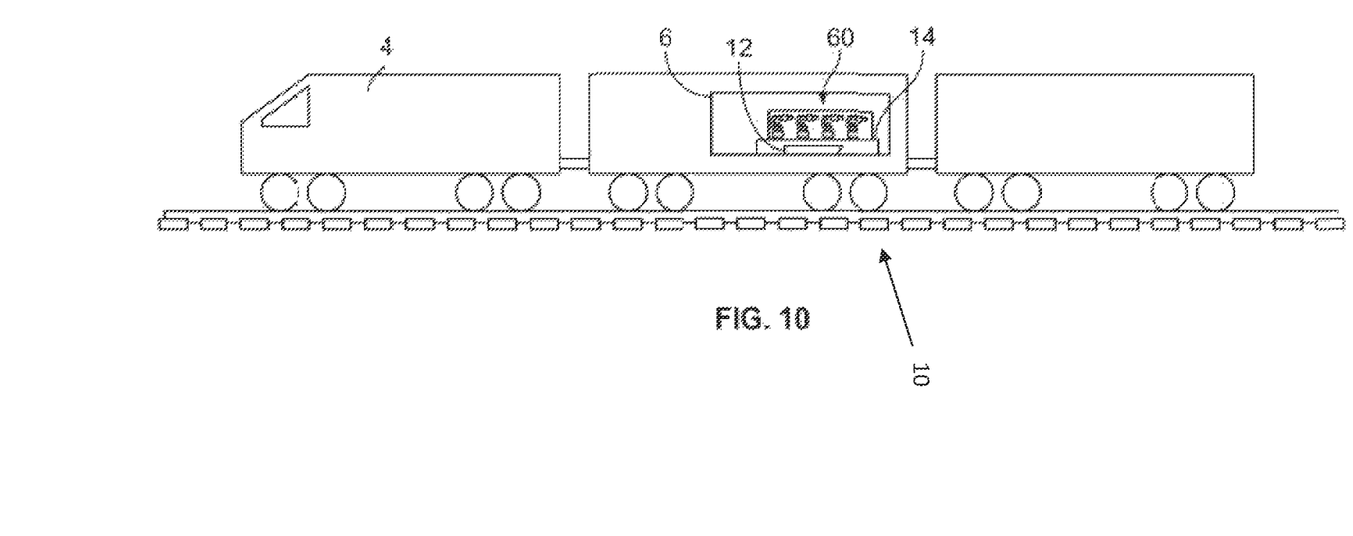
FIG. 10 illustrates a side plan view of a motor sensor system.

Referring now FIG. 10, in some embodiments or aspects, the motor sensing system or an individual motor sensor may be located on a vehicle 4. While the vehicle of FIG. 10 appears as a rail vehicle, in other examples the vehicle may be an off-road vehicle, heavy machinery, backhoe, tractor, automobile, truck, jeep, aircraft, shipping vehicle or other aquatic vehicle, or the like. The vehicle may have at least one operating compartment 6 housing some of the machinery used to run the vehicle which may include the engine and an air compressor 10. The air compressor 10 further has a motor 12 and a motor housing 14. Attached to the air compressor motor housing and air compressor motor may be the motor sensor or system of motor sensors. The motor sensor or system of motor sensors may also be applied to any motor located on the vehicle including the engine that runs the vehicle, pump motors, or other operating motors.

In one example, the air compressor and motor may be an existing air compressor and motor that is to be rebuilt in the field after use. For rebuild, an existing bus bar with accompanying sensor, or no sensor, may be removed from the compressor and/or motor. Then, a bus bar as described in relation to any of the example embodiments of FIGS. 1-9 that include a transducer that is at least partially encapsulated to prevent active transducer element from being exposed to debris may be coupled to the compressor or motor. The bus bar may be coupled in any manner described herein to any component described herein. As a result, the rebuild process provides a fast, simple, efficient, and inexpensive manner to replace a sensor of the compressor and/or motor. In an embodiment, the replacement bus bar may be pre-assembled (e.g., at a manufacturing facility that is remote from the motor or compressor) such that the bus bar, transducer or other sensor, and encapsulation are provided and available as a unit, e.g., the transducer is pre-attached to the bus bar, and at least part of the bus bar and transducer are pre-encapsulated with a dielectric, prior to removing the existing bus bar and replacing the existing bus bar with the replacement bus bar. In this manner, the bus bar, transducer, and dielectric may be assembled in a controlled environment, without a maintenance operator having to attach (and encapsulate) the transducer to the bus bar in the field. Different bus bar configurations may be provided, with transducers/encapsulation pre-attached thereto, for different motor or compressor applications, that is, the different bus bar configurations would match different existing bus bars of the motor or compressor systems, such that an existing bus bar can be swapped out not only with a new bus bar, but one that has a transducer pre-attached (and at least partially sealed) thereto.

In one or more embodiments, a system may be provided that includes a bus bar, and a transducer coupled to the bus bar and having one or more transducer elements. The system may also include a layer of dielectric material disposed between the bus bar and the transducer.

Optionally, the layer may at least partially encapsulate the transducer and at least partially encapsulates the bus bar.

Optionally, the bus bar may include a mounting bracket configured to mechanically couple to a motor, the mounting bracket may be configured to provide a space between the transducer and the motor, and the layer may be at least partially disposed in the space between the transducer and the motor.

Optionally, the bus bar may be disposed relative to the transducer such that electrical current of the bus bar may be detectable by at least one of the transducer elements.

Optionally, the dielectric material may be an epoxy, a ceramic, a silicone, or a combination thereof.

Optionally, the transducer may include transducer elements that may be configured to measure or detect one or both of an electrical current or a thermal load of a motor coupled to the bus bar.

Optionally, the layer of dielectric material may have a dielectric strength above 450 volts per mil.

Optionally, the layer of dielectric material may be between is between 1 millimeters and 15 millimeters thick.

In one or more embodiment, a system may be provided that may include a bus bar including a mounting bracket configured to couple the bus bar to a motor. The mounting bracket may also be configured to be removably coupled to the motor with at least one fastener, and a transducer may be coupled to the bus bar and having transducer elements. The transducer may be coupled to the bus bar such that the mounting bracket forms a space between the transducer and the motor. A layer of dielectric material may at least partially encapsulate the transducer, at least partially encapsulate the bus bar, and at least be partially within the space between the transducer and the motor.

Optionally, the dielectric material may be an epoxy, a ceramic, a silicone, or a combination thereof.

Optionally, the transducer may include transducer elements that may be configured to measure or detect one or both of an electrical current or a thermal load of a motor coupled to the bus bar.

Optionally, the layer of dielectric material may have a dielectric strength above 450 volts per mil Optionally, the layer of dielectric material may be between 1 millimeters and 15 millimeters thick.

In one or more embodiments, a method may be provided that includes removing a first bus bar and first sensor from a motor, and coupling a second bus bar with a second sensor coupled thereto to the motor to replace the first bus bar and first sensor. A layer of dielectric material may be positioned between the second bus bar and second sensor.

Optionally, coupling the second bus bar to the motor may comprise at least one of electrically coupling, or mechanically coupling the second bus bar to the motor.

Optionally, the second sensor may include at least one transducer element that is encapsulated by the layer of dielectric material.

Optionally, the method may also include coupling the second sensor to at least one monitoring device. In one aspect, coupling the second sensor to the at least one monitoring device may include at least one of electrically coupling, wired coupling, or wireless coupling.

Optionally, the second bus bar may be disposed relative to the second sensor such that electrical current of the bus bar may be detectable by at least one transducer element of the second sensor.

Optionally, the second sensor may include transducer elements that are configured to measure or detect one or both of an electrical current or a thermal load of the motor after the second bus bar is coupled to the motor.

As used herein, the terms "processor" and "computer," and related terms, e.g., "processing device," "computing device," and "controller" may be not limited to just those integrated circuits referred to in the art as a computer, but refer to a microcontroller, a microcomputer, a programmable logic controller (PLC), field programmable gate array, and application specific integrated circuit, and other programmable circuits. Suitable memory may include, for example, a computer-readable medium. A computer-readable medium may be, for example, a random-access memory (RAM), a computer-readable non-volatile medium, such as a flash memory. The term "non-transitory computer-readable media" represents a tangible computer-based device implemented for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. As such, the term includes tangible, computer-readable media, including, without limitation, non-transitory computer storage devices, including without limitation, volatile and non-volatile media, and removable and non-removable media such as firmware, physical and virtual storage, CD-ROMS, DVDs, and other digital sources, such as a network or the Internet.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A system comprising:
   a bus bar;
   a transducer coupled to the bus bar and having one or more transducer elements; and
   a layer of dielectric material disposed between the bus bar and the transducer;
   wherein the bus bar includes a mounting bracket configured to mechanically couple to a motor.

2. The system of claim 1, wherein the layer at least partially encapsulates the transducer and at least partially encapsulates the bus bar.

3. The system of claim 1, wherein the mounting bracket is configured to provide a space between the transducer and the motor, and the layer is at least partially disposed in the space between the transducer and the motor.

4. The system of claim 1, wherein the bus bar is disposed relative to the transducer such that electrical current of the bus bar is detectable by at least one of the one or more transducer elements.

5. The system of claim 1, wherein the dielectric material is an epoxy, a ceramic, a silicone, or a combination thereof.

6. The system of claim 1, wherein the one or more transducer elements are configured to measure or detect one or both of an electrical current or a thermal load of the motor coupled to the bus bar.

7. The system of claim 1, wherein the layer of dielectric material has a dielectric strength above 450 volts per mil.

8. The system of claim 1, wherein the layer of dielectric material is between 1 millimeter and 15 millimeters thick.

9. The system of claim 1, wherein the bus bar includes a bar portion and the mounting bracket extends as an appendage from the bar portion.

10. The system of claim 1, wherein the bus bar is J-shaped.

11. A system comprising:
    a bus bar including a mounting bracket configured to couple the bus bar to a motor, the mounting bracket also configured to be removably coupled to the motor with at least one fastener;
    a transducer coupled to the bus bar and having transducer elements, the transducer coupled to the bus bar such that the mounting bracket forms a space between the transducer and the motor; and
    a layer of dielectric material at least partially encapsulating the transducer, at least partially encapsulating the bus bar, and at least partially within the space between the transducer and the motor.

12. The system of claim 11, wherein the dielectric material is an epoxy, a ceramic, a silicone, or a combination thereof.

13. The system of claim 11, wherein the transducer elements are configured to measure or detect one or both of an electrical current or a thermal load of the motor when the bus bar is coupled to the motor.

14. The system of claim 11, wherein the layer of dielectric material has a dielectric strength above 450 volts per mil.

15. The system of claim 11, wherein the layer of dielectric material is between 1 millimeter and 15 millimeters thick.

16. A method comprising:
    removing a first bus bar and first sensor from a motor; and
    coupling a second bus bar with a second sensor coupled thereto to the motor to replace the first bus bar and the first sensor, a layer of dielectric material positioned between the second bus bar and second sensor; wherein the second bus bar includes a mounting bracket that extend as an appendage of the second bus bar.

17. The method of claim 16, wherein coupling the second bus bar to the motor comprises at least one of electrically coupling, or mechanically coupling the second bus bar to the motor.

18. The method of claim 16, wherein the second sensor includes at least one transducer element that is encapsulated by the layer of dielectric material.

19. The method of claim 16, wherein the second bus bar is disposed relative to the second sensor such that electrical current of the second bus bar is detectable by at least one transducer element of the second sensor.

20. The method of claim 16, wherein the second sensor includes transducer elements that are configured to measure or detect one or both of an electrical current or a thermal load of the motor after the second bus bar is coupled to the motor.

* * * * *